United States Patent
Park

(10) Patent No.: US 11,474,708 B2
(45) Date of Patent: Oct. 18, 2022

(54) MEMORY SYSTEM FOR HANDLING A BAD BLOCK AND OPERATION METHOD THEREOF

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 94 days.

(21) Appl. No.: 17/144,534

(22) Filed: Jan. 8, 2021

(65) Prior Publication Data
US 2021/0405888 A1   Dec. 30, 2021

(30) Foreign Application Priority Data

Jun. 29, 2020   (KR) .......................... 10-2020-0079297

(51) Int. Cl.
| | |
|---|---|
| *G06F 3/06* | (2006.01) |
| *G11C 29/00* | (2006.01) |
| *G06F 11/00* | (2006.01) |
| *G06F 11/14* | (2006.01) |
| *G06F 11/22* | (2006.01) |

(Continued)

(52) U.S. Cl.
CPC ............ *G06F 3/0619* (2013.01); *G06F 3/064* (2013.01); *G06F 3/0616* (2013.01); *G06F 3/0626* (2013.01); *G06F 3/0673* (2013.01); *G06F 9/4451* (2013.01); *G06F 11/008* (2013.01); *G06F 11/073* (2013.01); *G06F 11/079* (2013.01); *G06F 11/0787* (2013.01); *G06F 11/1012* (2013.01); *G06F 11/1048* (2013.01); *G06F 11/142* (2013.01); *G06F 11/2273* (2013.01); *G11C 29/04* (2013.01); *G11C 29/70* (2013.01); *G06F 2201/805* (2013.01)

(58) Field of Classification Search
CPC ...... G06F 3/0619; G06F 3/064; G06F 3/0673; G06F 11/142; G06F 11/2273; G06F 2201/805; G06F 11/0787; G06F 11/1048; G06F 11/073; G06F 11/079; G06F 9/4451; G06F 11/008; G06F 11/1012; G06F 3/0616; G06F 3/0626; G11C 29/04; G11C 29/70
USPC ....... 714/723, 718, 719, 763, 764, 768, 769, 714/773, 799; 365/200, 201, 185.09
See application file for complete search history.

(56) References Cited

U.S. PATENT DOCUMENTS 5,844,841 A * 12/1998 Takeuchi ........... G11C 16/0483
                                                              365/168
8,959,280 B2    2/2015 Yu et al.
(Continued)

OTHER PUBLICATIONS

Lin et al., Revive Bad Flash-Memory Pages by HLC Scheme, May 2019, IEEE, vol. 38, No. 5, pp. 860-873. (Year: 2019).*

(Continued)

*Primary Examiner* — John J Tabone, Jr.
(74) *Attorney, Agent, or Firm* — IP & T Group LLP

(57) ABSTRACT

A memory system includes a memory device including plural non-volatile memory blocks and a controller configured to determine whether a first memory block among the plural non-volatile memory blocks is re-usable after the first memory block is determined to be a bad block and copy second block information associated with a second memory block including a second program sequence number within a set range of a first program sequence number in the first memory block to first block information of the first memory block.

20 Claims, 8 Drawing Sheets

(51) Int. Cl.
    *G11C 29/04*     (2006.01)
    *G06F 11/10*     (2006.01)
    *G06F 9/445*     (2018.01)
    *G06F 11/07*     (2006.01)

(56) References Cited

U.S. PATENT DOCUMENTS

| | | | |
|---|---|---|---|
| 9,569,120 | B2 | 2/2017 | Ryan et al. |
| 9,804,922 | B2 | 10/2017 | Kochar et al. |
| 10,073,622 | B2 * | 9/2018 | Kim ............... G06F 3/0631 |
| 10,255,192 | B2 * | 4/2019 | Ke ................ G06F 12/0246 |
| 2016/0092325 | A1 * | 3/2016 | Bar ............... G06F 3/0619 |
| | | | 714/6.1 |
| 2017/0139839 | A1 * | 5/2017 | Ke ................ G06F 12/1009 |
| 2017/0351459 | A1 * | 12/2017 | Moon .............. G06F 3/0652 |
| 2018/0068731 | A1 * | 3/2018 | Kim .............. G11C 16/3459 |
| 2018/0121097 | A1 * | 5/2018 | Kim ............... G06F 3/064 |
| 2019/0004907 | A1 * | 1/2019 | Sela ............... G06F 11/073 |
| 2020/0034223 | A1 * | 1/2020 | Rori ............... G06F 11/073 |
| 2020/0310896 | A1 * | 10/2020 | Lee ................ G11C 29/44 |
| 2021/0405888 | A1 * | 12/2021 | Park ............... G06F 11/2273 |

OTHER PUBLICATIONS

Zhu et al., Fault Tolerant Algorithm for NVM to Reuse the Error Blocks, 2016, IEEE, pp. 54-59. (Year: 2016).*

* cited by examiner

FIG. 6

| BLOCK Parameters | Unit |
|---|---|
| Page Program time | μs |
| Block erase time | ms |
| Program/erase cycles | cycles |
| Data retention | Y/M/D |

…

MEMORY SYSTEM FOR HANDLING A BAD BLOCK AND OPERATION METHOD THEREOF

CROSS-REFERENCE TO RELATED APPLICATION

This patent application claims priority under 35 U.S.C. § 119(a) on Korean Patent Application No. 10-2020-0079297, filed on Jun. 29, 2020, the entire disclosure of which is incorporated herein by reference.

TECHNICAL FIELD

The disclosure relates to a memory system, and more specifically, an apparatus and a method for securing data protection in the memory system.

BACKGROUND

Recently, a paradigm for a computing environment has shifted to ubiquitous computing, which enables computer systems to be accessed virtually anytime, anywhere. As a result, the use of portable electronic devices, such as mobile phones, digital cameras, notebook computers, and the like, are rapidly increasing, Such portable electronic devices typically use or include a memory system that uses or embeds at least one memory device, i.e., a data storage device. The data storage device can be used as a main storage device or an auxiliary storage device of a portable electronic device.

Unlike a hard disk, a data storage device using a non-volatile semiconductor memory device is advantageous in that it has excellent stability and durability because it has no mechanical driving part (e.g., a mechanical arm), and has high data access speed and low power consumption. In the context of a memory system having such advantages, exemplary data storage devices include a universal serial bus (USB) memory device, a memory card having various interfaces, a solid state drive (SSD), or the like.

BRIEF DESCRIPTION OF THE DRAWINGS

The description herein makes reference to the accompanying drawings wherein like reference numerals refer to like parts throughout the figures.

FIG. 6 illustrates block parameters according to another embodiment of the disclosure.

DETAILED DESCRIPTION

Figure 1:
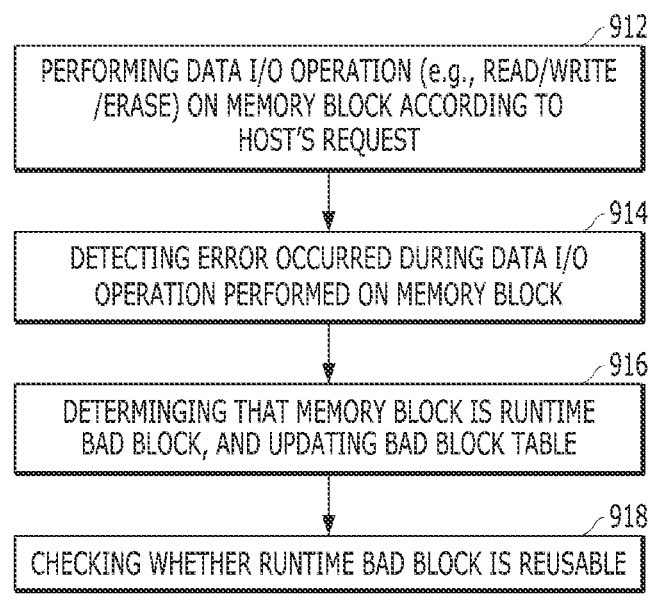
FIG. 1 illustrates a method for performing runtime bad block management according to an embodiment of the disclosure.

Various embodiments of the disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or might not necessarily be combined in the same embodiments.

In this disclosure, the terms "comprise," "comprising," "include," and "including" are open-ended. As used herein, these terms specify the presence of the stated elements/components and do not preclude the presence or addition of one or more other elements/components.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified blocks/unit/circuit/component is not currently operational (e.g., is not on). The blocks/units/circuits/components used with the "configured to" language include hardware—for example, circuits, memory storing program instructions executable to implement the operation, etc. Reciting that a block/unit/circuit/component is "configured to" perform one or more tasks is expressly intended not to invoke 35 U.S.C, § 112(f) for that block/unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' refers to any and all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as mobile phone or server, to perform various functions) and (c) circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuit may be distinguished from a second circuit.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

An embodiment of the disclosure provides a data process system and a method for operating the data processing system, which includes components and resources such as a memory system and a host, and which is capable of dynamically allocating plural data paths used for data communication between the components based on usages of the components and the resources.

An embodiment of the disclosure can provide an apparatus and a method for checking a re-usable memory block, after performing a runtime bad block management, to update information regarding memory blocks used for data input/output operations. The runtime bad block management can be performed when or after a memory system performs a data input/output operation in response to a request input from a host. The runtime bad block management is distinguishable from a bad block test which is performed by a manufacturer before the apparatus, e.g., memory system, is supplied to a user.

Even though a memory block could be determined to be healthy later and could be used again, the memory block may be determined as a bad block through the runtime bad block management operation. When information regarding a memory block determined as a bad block is deleted through the runtime bad block management operation, the apparatus and the method according to an embodiment of the disclosure can estimate a wear rate which could reflect a previous usage of the re-usable memory block before determined as the bad block through the runtime bad block management operation. Operation stability and reliability of the memory system could be improved because a state of the re-usable memory block is estimated, or calculated, and the re-usable memory block can be used based on the state.

In an embodiment, a memory system can include a memory device including plural non-volatile memory blocks; and a controller configured to determine whether a first memory block among the plural non-volatile memory blocks is re-usable after the first memory block is determined to be a bad block and copy second block information associated with a second memory block including a second program sequence number within a set range of a first program sequence number in the first memory block to first block information of the first memory block.

The controller can be further configured to perform a data input/output operation on at least one memory block among the plural non-volatile memory blocks, and determine the at least one memory block as the bad block when the at least one memory block satisfies a set condition during the data input/output operation.

The data input/output operation can include at least one of a read, a write or an erase operation.

Each of the first block information and the second block information can include a program/erase (P/E) cycle of the corresponding memory block.

The controller can be further configured to find the second memory block in a search of memory blocks by comparing a set number of most significant bits of the first program sequence number with those of a program sequence number of each of the memory blocks.

When multiple memory block candidates have the set number of most significant bits, the controller can be configured to find the second memory block by performing a test read operation on each of the first memory block and the candidates, and determine a single memory block among the candidates as the second memory block, the single memory block having an operating state which is the most similar to that of the first memory block.

The controller can be further configured to erase the first block information of the first memory block when the first memory block is determined to be the bad block.

The controller can be further configured to determine the first memory block to be a bad block through an operation for wear levelling or bad block management which is performed in the memory system without a request input from an external device.

In another embodiment, a method for operating a memory system can include determining whether a first memory block among plural non-volatile memory blocks is re-usable after the first memory block included in a memory device is determined to be a bad block; searching for a second memory block including a second program sequence number within a set range of a first program sequence number in the first memory block; and copying second block information associated with the second memory block to first block information of the first memory block.

The method can further include performing a data input/output operation on at least one memory block among the plural non-volatile memory blocks; and determining that the at least one memory block is the bad block when the at least one memory block satisfies a set condition during the data input/output operation.

The data input/output operation can include at least one of a read, a write or an erase operation.

Each of the first block information and the second block information can include a program/erase (P/E) cycle of the corresponding memory block.

The second memory block can be found in a search by comparing a set number of most significant bits of the first program sequence number with those of a program sequence number of each of the memory blocks.

When multiple memory block candidates have the same number of most significant bits, the searching for the second memory block can further include: performing a test read operation on the first memory block and the candidates; and determining a single memory block among the candidates as the second memory block, the single memory block having an operating state which is the most similar to that of the first memory block.

The method can further include erasing the first block information of the first memory block when the first memory block is determined to be the bad block.

The method can further include determining the first memory block to be the bad block through an operation for wear levelling or bad block management which is performed in the memory system without a request input from an external device.

In another embodiment, a controller can monitor operation states of plural memory blocks and determines a first memory block among the plural memory blocks to be a bad block when an operation state of the first memory block meets a set condition. The controller can be configured to: determine whether the first memory block is re-usable after the first memory block is determined to be a bad block; and copy second block information associated with a second memory block including a second program sequence number within a set range of a first program sequence number in the first memory block to first block information of the first memory block.

The controller can be further configured to perform a data input/output operation on at least one memory block among the plural non-volatile memory blocks, and determine that the at least one memory block is the bad block when the at least one memory block satisfies a set condition during the data input/output operation.

The controller can be configured to find the second memory block in a search of memory blocks by comparing a set number of most significant bits of the first program sequence number with those of a program sequence number of each of the memory blocks.

When multiple memory block candidates have the same set number of most significant bits, the controller can be configured to finds the second memory block by performing a test read operation on the first memory block and the candidates, and determine a single memory block among the candidates as the second memory block, the single memory block having an operating state which is the most similar to that of the first memory block.

In another embodiment, a controller can control a memory device including a runtime bad block among plural nonvolatile memory blocks. An operating method of the controller includes interpreting information of program/erase cycles of a first normal memory block among the non-volatile memory blocks as that of the runtime bad block, the first normal memory block and the runtime bad block having respective program sequence numbers within a set range; and interpreting the runtime bad block with the information as a second normal memory block.

Embodiments of the disclosure are described below with reference to the accompanying drawings, wherein like numbers reference refers to like elements.

FIG. 1 illustrates a method for performing runtime bad (RTB) block management according to an embodiment of the disclosure. Runtime bad block management includes determining, during or after an operation of the memory system, which of the memory blocks is/are bad block(s), based on an operation state of the corresponding memory block. Herein, a memory block can be a group of non-volatile memory cells in a memory system, according to a specific standard or criterion. For example, a memory block can be a group of non-volatile memory cells which are erased together in a single erase operation. An internal configuration of the memory system is described below with reference to FIGS. 2 to 3.

Referring to FIG. 1, the method for performing runtime bad block management may include performing a data input/output (I/O) operation (e.g., a read/write/erase operation) on a specific memory block in response to a host's request (912). The memory system 110 (shown in FIGS. 2 to 3) may receive a read request, a write request, or an erase request input from a host 102 (shown in FIGS. 2 to 3). The read request, write request, or erase request is related to specific data stored or to be stored in the memory system 110. For example, the read request may cause the memory system 110 to output data stored in a specific location to the host 102, and the write request may cause the memory system 110 to store data transmitted along with the a write request. In response to the read request, the write request or the erase request, the memory system 110 can perform a data input/output (I/O) operation.

The method for performing runtime bad block management may include detecting an error occurring during the data input/output operation performed on the specific memory block (914). For example, a controller 130 (shown in FIGS. 2 to 3) in the memory system 110 uses at least one open block or free block in the memory device 150 (shown in FIGS. 2 to 3) to perform a write operation corresponding to a write request. A program operation performed on the specific memory block in the memory device 150 might not be normally performed (e.g., a program failure). When the program operation fails, the controller 130 can program data transmitted together with the write request in another memory block other than the specific memory block.

The method for performing runtime bad block management may further include determining that the memory block in which the data input/output operation is not normally performed is a runtime bad block and updating a bad block table (916) to reflect such information (e.g., adding a block address of the memory block to the bad block table). The bad block table has a data structure that identifies bad block(s) (or block(s) not currently usable), among all memory blocks included in the memory device 150. For example, when a write operation for programming data in the memory system 110 fans on a specific memory block, the memory system 110 can program the data in another memory block and determine the specific memory block as a runtime bad block.

After determining the specific memory block as a bad block, the memory system 110 may add information (e.g., a block address) about the specific memory block to the bad block table. The bad block table can include positional information regarding a bad block which is determined by the run-time bad block management. When allocating a memory block for programming new data, the memory system 110 can exclude memory block(s) identified by the bad block table. According to an embodiment, the memory system 110 may store block information regarding a plurality of memory blocks in the memory device 150. An example of block information is described below with reference to FIG. 6. Because the memory system 110 does not use any memory block in the bad block table, block information corresponding to any such memory block identified by the bad block table may be no longer needed. Accordingly, the memory system 110 may delete block information regarding a bad memory block identified by the bad block table. On the other hand, when valid data is stored in the memory block added to the bad block table, the memory system 110 may copy the valid data to another memory block, and then update map data (or meta data) of the copied data.

There are various reasons as to why a runtime bad block occurs in the memory device 150. For example, severe wear of a specific memory block may render such memory block incapable of performing data input/output, in which case the memory system 150 may determine the specific memory block as a bad block. As another example, even in non-severe wear conditions for a specific memory block based on program/erase cycles of that block, a program operation may fail temporarily due to interference or the like. In order to avoid delay in the data input/output operation, when the program operation on a specific memory block fails, the memory system 110 may program the data in another memory block and notify the host 102 that the program operation has been successfully completed.

When a memory block is included in the bad block table as a result of a temporary reason, e.g., interference, efficiency of resources could be reduced because that memory block is not used any more. Accordingly, the method for performing runtime bad block management may include checking whether the runtime bad block is re-usable (918). This check can be performed by the memory system autonomously, i.e., without a command or a request input from an external device such as the host 102. Thus, according to an embodiment, the memory system 110 may check whether the runtime bad block is re-usable as a background operation. That is, when no data input/output operation is being performed, the memory system 110 may check whether or not a runtime bad block based on the bad block table is re-usable.

According to an embodiment, the memory system 110 may check whether to reuse a runtime bad block only among memory blocks included in the bad block table. For example, a defect may be detected during a post-manufacturing inspection process of a memory device, indicating that some of the memory blocks are defective. The memory system 110 may scan all memory blocks in the memory device 150 to identify defective memory block(s), which then may be added to the bad block table. Accordingly, a runtime bad block may be distinguished from a bad block which is initially determined by a manufacturer before the memory system 110 is provided to a user. In the process of checking whether a runtime bad block is re-usable, the memory system 110 may skip defective memory block(s) determined to be defective when the memory device 150 is manufactured. To this end, the bad block table may include an identifier that is associated with a memory block in the bad block table for indicating whether the memory block is a runtime bad block or a defective bad block determined to be defective during a manufacturing process.

According to an embodiment, the memory system 110 checks whether a memory block determined as a bad block is re-useable during a background operation (e.g., wear leveling operation, garbage collection, etc.) of the memory system, not during a data input/output operation corresponding to a request input from the host 102. In making the re-useable determination during the background operation, the memory system 110 checks an indicator associated with an individual block to determine whether the memory block is a runtime bad block or a bad block due to a defect occurred during the manufacturing process. Even if an operation state of a runtime bad block was not healthy, it might be restored to a usable level after a time passes. Checking whether to reuse a memory block determined as a runtime bad block, during the background operation, may advantageously increase available resources in the memory device 150.

Hereinafter, various embodiments of the data processing system 100 are described. Specifically, FIGS. 2 to 3 show the memory system 110 performing a data input/output operation in response to a request from the host 102, or an operation performed by the memory system 110 and memory in order to increase the efficiency of the data input/output operation.

Figure 2:
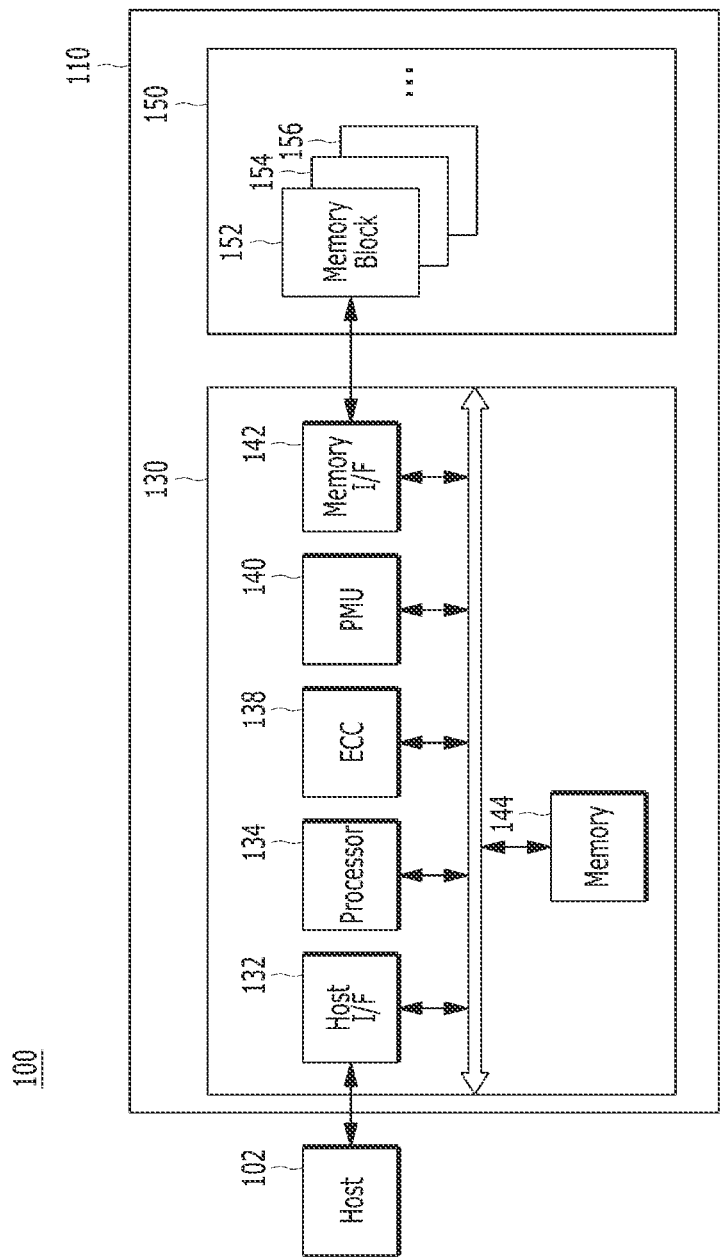
FIG. 2 illustrates a data processing system according to another embodiment of the disclosure.
Figure 3:
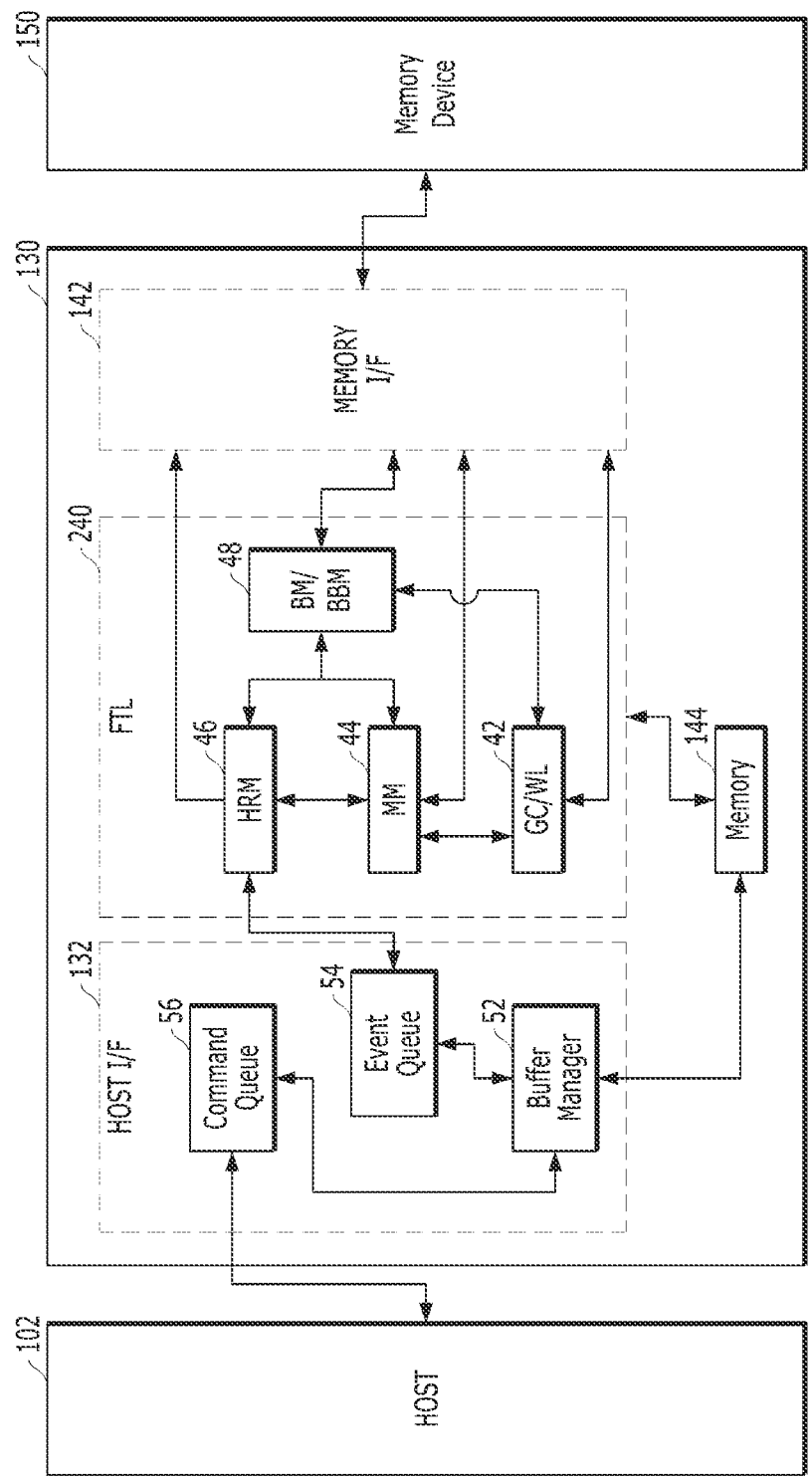
FIG. 3 illustrates a memory system according to another embodiment of the disclosure.

FIG. 2 illustrates a data processing system according to an embodiment of the disclosure.

Referring to FIG. 2, the data processing system 100 may include a host 102 operably engaged with the memory system 110. The host 102 may include (or be embodied as) any of various devices including a portable electronic device (e.g., a mobile phone, an MP3 player, a laptop computer, etc.) or a non-portable electronic device (e.g., a desktop computer, a game player, a television, a projector, etc.).

The host 102 may also include at least one operating system (OS), which can control functions and operations performed in the host 102. The OS can provide interoperability between the host 102 engaged operatively with the memory system 110 and the user who intends to store data in the memory system 110. The OS may support functions and operations corresponding to user requests. By way of example but not limitation, the OS can be a general operating system and/or a mobile operating system according to mobility of the host 102. The general operating system may be a personal operating system and/or an enterprise operating system according to system requirements or a user environment. As compared with the personal operating system, the enterprise operating system can be specialized for securing and supporting high performance computing.

The mobile operating system may be subject to support services or functions for mobility (e.g., a power saving function). The host 102 may include a plurality of operating systems. The host 102 may execute is multiple operating systems interlocked with the memory system 110, corresponding to a user request. The host 102 may transmit a plurality of commands corresponding to the user's requests into the memory system 110, thereby causing operations corresponding to commands to be performed within the memory system 110.

The controller 130 in the memory system 110 may control the memory device 150 in response to a request or a command input from the host 102. For example, the controller 130 may perform a read operation to provide a piece of data read from the memory device 150 for the host 102 and may perform a write operation (or a program operation) to store a piece of data input from the host 102 in the memory device 150, In order to perform data input/output (I/O) operations, the controller 130 may control and manage internal operations for data read, data program, data erase, or the like.

According to an embodiment, the controller 130 may include a host interface (I/F) 132, a processor 134, error correction circuitry (i.e., ECC) 138, a power management unit (PMU) 140, a memory interface 142, and a memory 144. The controller 130 is not limited to the specific configuration illustrated in FIG. 2. Rather, the configuration of the controller 130 may vary according structure, function, operation performance, or the like, of the memory system 110. For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. The specific set of components in the controller 130 may be different depending on the particular implementation of the memory system 110.

The host 102 and the memory system 110 may include a controller or an interface for transmitting and receiving signals, data, and the like, in accordance with one or more communication protocols. For example, the host interface 132 in the memory system 110 may include a component capable of exchanging signals, data, and the like, with the host 102.

The host interface 132 may receive signals, commands (or requests), and/or data input from the host 102. For example, the host 102 and the memory system 110 may use a communicate protocol to transmit and receive data between each other. Examples of protocols or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIS or PCIe), Serial-attached SCSI (SAS), Serial Advanced Technology Attachment (SATA), Mobile Industry Processor Interface (MIPI), and the like. According to an embodiment, the host interface 132 is a kind of layer for exchanging data with the host 102 and is implemented with, or driven by, firmware called a host interface layer (HIL).

In some embodiments, Integrated Drive Electronics (IDE) or Advanced Technology Attachment (ATA) may be used as one of the interfaces for transmitting and receiving data between the host 102 and the memory system 110. For example, IDE or ATA may use a cable including 40 wires connected in parallel to support data transmission and reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. One of the plurality of memory system 110 set as the master may be used as a primary memory device, and others may be used as a secondary memory device. For example, IDE or ATA may include Fast-ATA, ATAPI, and Enhanced IDE (EIDE).

Serial Advanced Technology Attachment (SATA) is a kind of serial data communication interface that is compatible with various ATA standards of parallel data communication interfaces which is used by Integrated Drive Electronics (IDE) devices. The 40 wires in the IDE interface can be reduced to six wires in the SATA interface. For example, 40 parallel signals for the IDE can be converted into 6 serial signals for SATA to be transmitted between each other. SATA has been widely used because of its faster data transmission and reception rate and its less resource consumption in the host 102 used for data transmission and reception, SATA may support connection with up to 30 external devices to a single transceiver included in the host 102. In addition, SATA can support hot plugging that allows an external device to be attached or detached from the host 102, even while data communication between the host 102 and another device is being executed. Thus, the memory system 110 may be connected or disconnected as an additional device, like a device supported by a universal serial bus (USB) even when the host 102 is powered on. For example, in the host 102 having an eSATA port, the memory system 110 may be freely detached like an external hard disk.

Small Computer System Interface (SCSI) is a kind of serial data communication interface used for connection between a computer, a server, and/or other peripheral devices. SCSI can provide a high transmission speed, as compared with other interfaces such as IDE and SATA. In SCSI, the host 102 and at least one peripheral device (e.g., memory system 110) are connected in series, but data transmission and reception between the host 102 and each peripheral device may be performed through a parallel data communication. With SCSI, it is easy to connect to, or disconnect from, the host 102 a device such as the memory system 110. SCSI can support connections of 15 other devices to a single transceiver included in host 102.

Serial Attached SCSI (SAS) can be understood as a serial data communication version of the SCSI. In SAS, not only the host 102 and a plurality of peripheral devices are connected in series, but also data transmission and reception between the host 102 and each peripheral device may be performed in a serial data communication scheme. SAS can support connection between the host 102 and the peripheral device through a serial cable instead of a parallel cable, to easily manage equipment using SAS and enhance or improve operational reliability and communication performance. SAS may support connections of eight external devices to a single transceiver in the host 102.

Non-volatile memory express (NVMe) is a kind of interface based at least on a Peripheral Component Interconnect Express (PCIe) designed to increase performance and design flexibility of the host 102, servers, computing devices, and the like equipped with the non-volatile memory system 110. PCIe can use a slot or a specific cable for connecting the host 102 (e.g., a computing device) and the memory system 110 (e.g., a peripheral device). For example, PCIe can use a plurality of pins (for example, 18 pins, 32 pins, 49 pins, 82 pins, etc.) and at least one wire (e.g., x1, x4, x8, x16, etc.) to achieve high speed data communication over several hundred MB per second (e.g., 250 MB/s, 500 MB/s, 984.6250 MB/s, 1969 MB/s, etc.). According to an embodiment, the PCIe scheme may achieve bandwidths of tens to hundreds of Giga bits per second. A system using the NVMe can make the most of an operation speed of the non-volatile memory system 110, such as an SSD, which operates at a higher speed than a hard disk.

According to an embodiment, the host 102 and the memory system 110 may be connected through a universal serial bus (USB). USB is a kind of scalable, hot-pluggable plug-and-play serial interface that can provide cost-effective standard connectivity between the host 102 and a peripheral device, such as a keyboard, a mouse, a joystick, a printer, a scanner, a storage device, a modem, a video camera, and the like. A plurality of peripheral devices such as the memory system 110 may be coupled to a single transceiver in the host 102.

Referring to FIG. 2, the error correction circuitry 138 may correct error bits of data to be processed in and output from the memory device 150, which may include an error correction code (ECC) encoder and an ECC decoder. The ECC encoder may perform error correction encoding of data to be programmed in the memory device 150 to generate encoded data into which a parity bit is added and store the encoded data in memory device 150. The ECC decoder may detect and correct errors contained in data read from the memory device 150 when the controller 130 reads the data stored in the memory device 150. For example, after performing error correction decoding on the data read from the memory device 150, the error correction circuitry 138 may determine whether the error correction decoding has succeeded and output an instruction signal (e.g., a correction success signal or a correction fail signal). The error correction circuitry 138 may use a parity bit generated during the ECC encoding process for correcting the error bit(s) of the read data. When the number of the error bits is greater than or equal to a threshold number of correctable error bits, the error correction circuitry 138 might not correct error bits but instead may output an error correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and the like. The error correction circuitry 138 may include any and all circuits, modules, systems, and/or devices for performing the error correction operation based on at least one of the above described codes.

For example, the ECC decoder may perform hard decision decoding or soft decision decoding to data transmitted from the memory device 150. Here, hard decision decoding can be understood as one of two methods (i.e., the hard decision decoding and the soft decision decoding) broadly classified for error correction. The hard decision decoding may include an operation of correcting an error by reading each bit or piece of digital data from a non-volatile memory cell in the memory device 150 as either '0' or '1'. Because the hard decision decoding handles a binary logic signal, the circuit/algorithm design or configuration may be simpler and processing speed may be faster than soft decision decoding.

Soft decision decoding may quantize a threshold voltage of a non-volatile memory cell in the memory device 150 by two or more quantized values (e.g., multiple bit data, approximate values, an analog value, and the like) in order to correct an error based on the two or more quantized values. The controller 130 may receive two or more quantized values from a plurality of non-volatile memory cells in the memory device 150, and then perform decoding based on information generated by characterizing the quantized values as a combination of information such as conditional probability or likelihood.

According to an embodiment, the ECC decoder may use a low-density parity-check and generator matrix (LDPC-GM) code among methods designed for the soft decision decoding. The low-density parity-check (LDPC) code uses an algorithm that can read values of data from the memory device 150 in several bits according to reliability, not simply data of 1 or 0 like hard decision decoding, and iteratively repeats the process through message exchange in order to improve reliability of the values. Then, each bit is filially determined as 1 or 0. For example, a decoding algorithm using LDPC codes provides probabilistic decoding. Through hard decision decoding, the value output from a non-volatile memory cell is determined as 0 or 1. Compared to hard decision decoding, soft decision decoding may determine the value stored in the non-volatile memory cell based on stochastic information. Regarding bit-flipping (which may be considered an error that can occur in the memory device 150), soft decision decoding may provide improved probability of correcting errors) and recovering data, as well as provide reliability and stability of corrected data. The LDPC-GM code may employ a scheme in which internal LDGM codes can be concatenated in series with high-speed LDPC codes.

According to an embodiment, the ECC decoder may use, for example, low-density parity-check convolutional codes (LDPC-CCs) code for soft decision decoding. LDPC-CCs code may use a linear time encoding scheme and pipeline decoding based on a variable block length and a shift register.

According to an embodiment, the ECC decoder may use, for example, a Log Likelihood Ratio Turbo Code (LLR-TC) for soft decision decoding. Log Likelihood Ratio (LLR) may be calculated as a non-linear function for a distance between a sampled value and an ideal value. In addition, Turbo Code (TC) may include a simple code (for example, a Hamming code) in two or three dimensions and repeat decoding in a row direction and a column direction to improve reliability of values.

The power management unit (PMU) 140 may control electrical power provided in the controller 130. The PMU 140 may monitor the electrical power supplied to the memory system 110 (e.g., a voltage supplied to the controller 130) and provide the electrical power to components in the controller 130. The PMU 140 can not only detect power-on or power-off, but also generate a trigger signal to enable the memory system 110 to back up a current state urgently when the electrical power supplied to the memory system 110 is unstable.

According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory. For example, when the memory device 150 includes a NAND flash memory, the memory interface 142 includes a NAND flash controller (NFC). The memory interface 142 may provide an interface for handling commands and data between the controller 130 and the memory device 150. In accordance with an embodiment, the memory interface 142 may be implemented through, or driven by, firmware called a flash interface layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in units of 8-bit or 16-bit data. Data communication between the controller 130 and the memory device 150 may be achieved through at least one interface regarding an asynchronous single data rate (SDR), a synchronous double data rate (DDR), and a toggle double data rate (DDR).

The memory 144 may be a type of working memory in the memory system 110 or the controller 130, while storing temporary or transactional data for operations in the memory system 110 and the controller 130. For example, the memory 114 may temporarily store read data output from the memory device 150 in response to a request from the host 102, before the read data is output to the host 102. In addition, the controller 130 may temporarily store write data input from the host 102 in the memory 144, before programming the write data in the memory device 150. When the controller 130 controls operations such as data read, data write, data program, or data erase of the memory device 150, a piece of data transmitted or generated between the controller 130 and the memory device 150 of the memory system 110 may be stored in the memory 144.

In addition to the read data or write data, the memory 144 may store information (e.g., map data, read requests, program requests, etc.) used for inputting or outputting data between the host 102 and the memory device 150. According to an embodiment, the memory 144 may include a command queue, a program memory, a data memory, a write buffer/cache, a read buffer/cache, a data buffer/cache, a map buffer/cache, and/or the like. The controller 130 may allocate some storage space in the memory 144 for a component which is used to carry out a data input/output operation. For example, the write buffer in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 2 illustrates the memory 144 disposed within the controller 130, the embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control overall operation of the memory system 110. For example, the processor 134 may control a program operation or a read operation on the memory device 150, in response to a write request or a read request entered from the host 102. According to an embodiment, the processor 134 may execute firmware to control the program operation or the read operation on the memory system 110. Herein, the firmware may be referred to as a flash translation layer (FTL). An example of the FTL is described below in detail, referring to FIG. 3. According to an embodiment, the processor 134 may be implemented with a microprocessor or a central processing unit (CPU).

According to an embodiment, the memory system 110 may be implemented with at least one multi-core processor. The multi-core processor is a kind of circuit or chip in which two or more cores, which are considered distinct processing regions, are integrated. For example, when a plurality of cores in the mufti-core processor drive or execute a plurality of flash translation layers (FTLs) independently, data input/output speed (or performance) of the memory system 110 may be improved. According to an embodiment, the data input/output (I/O) operations in the memory system 110 may be independently performed through different cores in the multi-core processor.

The processor 134 may perform an operation corresponding to a request or a command input from the host 102. Further, the memory system 110 may perform an operation without a command or a request input from an external device such as the host 102. An operation performed by the controller 130 in response to a request or command input from the host 102 may be considered a foreground operation, while an operation performed by the controller 130 independently (e.g., without a request or command input from the host 102) may be considered a background operation. The controller 130 may perform foreground or background operations for read, write or program, erase and the like, regarding data in the memory device 150. In addition, a parameter set operation corresponding to a set parameter command or a set feature command as a set command transmitted from the host 102 may be considered a foreground operation. As a background operation, i.e., not in response to a command transmitted from the host 102, the controller 130 may perform garbage collection (GC), wear leveling (WL), bad block management for identifying and processing bad blocks in relation to a plurality of memory blocks 152, 154, 156 in the memory device 150.

According an embodiment, substantially similar operations may be performed as both a foreground operation and a background operation. For example, when the memory system 110 performs garbage collection in response to a request or a command input from the host 102 (e.g., Manual GC), garbage collection may be considered a foreground operation. When the memory system 110 performs garbage collection independently of the host 102 (e.g., Auto GC), garbage collection may be considered a background operation.

When the memory device 150 includes a plurality of dies (or a plurality of chips) including non-volatile memory cells, the controller 130 may be configured to perform parallel processing regarding plural requests or commands input from the host 102 to improve performance of the memory system 110. For example, the transmitted requests or commands may be distributed to a plurality of dies or a plurality of chips in the memory device 150 and processed simultaneously. The memory interface 142 may be connected to a plurality of dies or chips in the memory device 150 through at least one channel and at least one way. When the controller 130 distributes and stores data in the plurality of dies through channel(s)/way(s) in response to requests or a command associated with a plurality of pages including non-volatile memory cells, plural operations corresponding to the requests or the commands may be performed simultaneously or in parallel. Such a processing method or scheme may be considered as an interleaving method. Because data input/output speed of the memory system 110 operating with the interleaving method may be faster than that without the interleaving method, data I/O performance of the memory system 110 may be improved.

By way of example but not limitation, the controller 130 may recognize statuses regarding a plurality of channels (or ways) associated with a plurality of memory dies in the memory device 150. The controller 130 may determine the status of each channel or each way as one of, for example, a busy status, a ready status, an active status, an idle status, a normal status, and/or an abnormal status. The determination of which channel or way an instruction (and/or a data) is delivered through by the controller 130 may be associated with a physical block address, e.g., which die(s) the instruction (and/or the data) is delivered into. The controller 130 may refer to descriptors delivered from the memory device 150. The descriptors may include a block or page of parameters that describe relevant characteristics about the memory device 150; each parameter is data with a set format or structure. For instance, the descriptors may include device descriptors, configuration descriptors, unit descriptors, and the like. The controller 130 may refer to, or use, the descriptors to determine via which channel(s) or way(s) an instruction or a data is exchanged.

The memory device 150 may include the plurality of memory blocks 152, 154, 156, each of which includes a plurality of non-volatile memory cells. According to an embodiment, one memory block may be a group of non-volatile memory cells erased together. The memory block 152, 154, 156 may include a plurality of pages, each of which may be a group of non-volatile memory cells read or programmed together. In one embodiment, each memory block 152, 154, 156 may have a three-dimensional stack structure for a high integration. Further, the memory device 150 may include a plurality of dies, each die including a plurality of planes, each plane including multiple memory blocks, e.g., some of all memory blocks 152, 154, 156 in the memory device 150. Configuration of the memory device 150 may be different for different desired performances of the memory system 110.

Each of the plurality of memory blocks 152, 154, 156 may be a single-level cell (SLC) memory block, or a multi-level cell (MLC) memory block, according to the number of bits that can be stored or represented in one memory cell of that block. An SLC memory block includes a plurality of pages implemented by memory cells, each storing one bit of data. An SLC memory block may have high data I/O operation performance and high durability. An MLC memory block includes a plurality of pages implemented by memory cells, each storing multi-bit data (e.g., two bits or more). An MLC memory block may have larger storage capacity for the same space compared to an SLC memory block. Thus, an MLC memory block may be highly integrated in a view of storage capacity.

In an embodiment, the memory device 150 may be implemented with MLC memory blocks such as double level cell (DLC) memory blocks, triple-level cell (TLC) memory blocks, quadruple-level cell (QLC) memory blocks or a combination thereof. A double-level cell (DLC) memory block may include a plurality of pages implemented by memory cells, each capable of storing 2-bit data. A triple-level cell (TLC) memory block may include a plurality of pages implemented by memory cells, each capable of storing 3-bit data. A quadruple-level cell (QLC) memory block may include a plurality of pages implemented by memory cells, each capable of storing 4-bit data. In another embodiment, the memory device 150 may be implemented with one or more blocks, each of which include a plurality of pages implemented by memory cells, each capable of storing five or more bits of data.

According to an embodiment, the controller 130 may use a multi-level cell (MLC) memory block in the memory device 150 as an SLC memory block. A data input/output speed of the multi-level cell (MLC) memory block may be slower than that of the SLC memory block. That is, when an MLC memory block is used as an SLC memory block, a margin for a read or program operation (e.g., operation-timing margin) may be reduced. The controller 130 may utilize a faster data input/output speed when using the MLC memory block as an SLC memory block. For example, the controller 130 may use an MLC memory block as a buffer to temporarily store a piece of data, because the buffer may require a high data input/output speed for improving performance of the memory system 110.

According to an embodiment, the controller 130 may program pieces of data in a multi-level cell (MLC) a plurality of times without performing an erase operation on the corresponding MLC memory block in the memory device 150. Non-volatile memory cells have a feature that does not support data overwrite. However, the controller 130 may use a feature in which an MLC may store multi-bit data, in order to program plural pieces of 1-bit data in the MLC a plurality of times. For an overwrite operation for MLC, the controller 130 may store the number of program times as separate operation information when a single piece of 1-bit data is programmed in a non-volatile memory cell. According to an embodiment, an operation for uniformly levelling threshold voltages of non-volatile memory cells may be carried out before another piece of data is overwritten in the same non-volatile memory cells.

In an embodiment, the memory device 150 may be embodied as a non-volatile memory such as a flash memory, for example, as a NAND flash memory, a NOR flash memory, and the like. In one embodiment, the memory device 150 may be implemented by at least one of a phase change random access memory (PCRAM), ferroelectrics random access memory (FRAM), a spin injection magnetic is memory, and a spin transfer torque magnetic random access memory (S-MRAM), or the like.

Referring to FIG. 3, the controller 130 in a memory system operates along with the host 102 and the memory device 150. As illustrated, the controller 130 includes a flash translation layer (FTL) 240, in addition to a host interface 132, the memory interface 142, and the memory 144, which were previously identified in connection with FIG. 2.

According to an embodiment, the error correction circuitry 138 in FIG. 2 may be included in the flash translation layer (FTL) 240. In another embodiment, the error correction circuitry 138 may be implemented as a separate module, a circuit, or firmware, which is included in, or associated with, the controller 130.

The host interface 132 may be capable of handling commands, and data transmitted from the host 102. By way of example but not limitation, the host interface 132 may include a command queue 56, a buffer manager 52, and an event queue 54. The command queue 56 may sequentially store commands, and data, which are received from the host 102, and output them to the buffer manager 52, for example, in the order in which they are stored. The buffer manager 52 may classify, manage, or adjust the commands, and the data, which are received from the command queue 56. The event queue 54 may sequentially transmit events for processing the commands and the data received from the buffer manager 52.

A plurality of commands or data of the same characteristic (e.g., read or write commands) may be transmitted from the host 102, or plurality of commands and data of different characteristics may be transmitted to the memory system 110 after being mixed or jumbled by the host 102. For example, a plurality of commands for reading data (read commands) may be delivered, or commands for reading data (read command) and programming/writing data (write command) may be alternately transmitted to the memory system 110. The host interface 132 may store commands and data, which are transmitted from the host 102, to the command queue 56 sequentially. Thereafter, the host interface 132 may estimate or predict what kind of internal operation the controller 130 will perform according to the characteristics of commands and data, which have been received from the host 102. The host interface 132 may determine a processing order and a priority of commands and data, based at least on their characteristics.

According to characteristics of commands and data, which are transmitted from the host 102, the buffer manager 52 in the host interface 132 may determine whether the buffer manager 52 should store commands and data, in the memory 144, or whether the buffer manager 52 should deliver the commands and the data to the flash translation layer 240. The event queue 54 may receive events from the buffer manager 52, which are to be internally executed and processed by the memory system 110 or the controller 130 in response to the commands and the data, which are transmitted from the host 102, in order to deliver the events to the flash translation layer 240 in the order received.

In accordance with an embodiment, the flash translation layer (FTL) 240 illustrated in FIG. 3 may implement a multi-thread scheme to perform the data input/output (I/O) operations. A multi-thread FTL may be implemented through a multi-core processor using multi-thread in the controller 130.

In accordance with an embodiment, the flash translation layer 240 may include a host request manager (HRM) 46, a map manager (MM) 44, a state manager 42, and a block manager 48. The host request manager (HRM) 46 may manage the events from the event queue 54. The map manager (MM) 44 may handle or control map data. The state manager 42 may perform garbage collection (GC) or wear leveling (WL). The block manager 48 may execute commands or instructions on a block in the memory device 150.

By way of example but not limitation, the host request manager (HRM) 46 may use the map manager (MM) 44 and the block manager 48 to handle or process requests according to the read and program commands, and events which are delivered from the host interface 132.

The host request manager (HRM) 46 may send an inquiry request to the map data manager (MM) 44, to determine a physical address corresponding to the logical address which is received with the events. The host request manager (HRM) 46 may send a read request with the physical address to the memory interface 142, to process the read request (handle the events). In one embodiment, the host request manager (HRM) 46 may send a program request (write request) to the block manager 48 to program data to a specific empty page (no data) in the memory device 150, and then may transmit a map update request corresponding to the program request to the map manager (MM) 44, in order to update an item relevant to the programmed data in information of mapping the logical-physical addresses to each other.

The block manager 48 may convert a program request delivered from the host request manager (HRM) 46, the map data manager (MM) 44, and/or the state manager 42 into a flash program request used for the memory device 150, in order to manage flash blocks in the memory device 150. In order to maximize or enhance program or write performance of the memory system 110, the block manager 48 may collect program requests and send flash program requests for multiple-plane and one-shot program operations to the memory interface 142. In an embodiment, the block manager 48 sends several flash program requests to the memory interface 142 to enhance or maximize parallel processing of the mufti-channel and multi-directional flash controller.

In one embodiment, the block manager 48 may be configured to manage blocks in the memory device 150 according to the number of valid pages, select and erase blocks having no valid pages when a free block is needed, and select a block including the least number of valid pages when it is determined that garbage collection is to be performed. The state manager 42 may perform garbage collection to move the valid data from the selected block(s) to an empty block and erase the block(s) containing the moved valid data so that the block manager 48 may have enough free blocks (i.e., empty blocks with no data). When the block manager 48 provides information regarding a block to be erased to the state manager 42, the state manager 42 may check all flash pages of the block to be erased to determine whether each page is valid.

For example, to determine validity of each page, the state manager 42 may identify a logical address recorded in an out-of-band (OOB) area of each page. To determine whether each page is valid, the state manager 42 may compare the physical address of the page with the physical address mapped to the logical address obtained from the inquiry request. The state manager 42 sends a program request to the block manager 48 for each valid page. A mapping table may be updated through the update of the map manager 44 when the program operation is complete.

The map manager 44 may manage a logical-to-physical (L2P) mapping table. The map manager 44 may process various requests, for example, queries and updates, which are generated by the host request manager (HRM) 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

When garbage collection is performed, the state manager 42 copies valid page(s) into a free block, and the host request manager 46 may program the latest version of the data for the same logical address of the page and currently issue an update request. When the state manager 42 requests the map update in a state in which copying of valid page(s) has not been properly completed, the map manager 44 might not perform the mapping table update. This is because the map request is issued with old physical information when the status manger 42 requests a map update and a valid page copy is completed later. The map manager 44 may perform a map update operation to ensure accuracy when, or only if, the latest map table still points to the old physical address.

Figure 4:
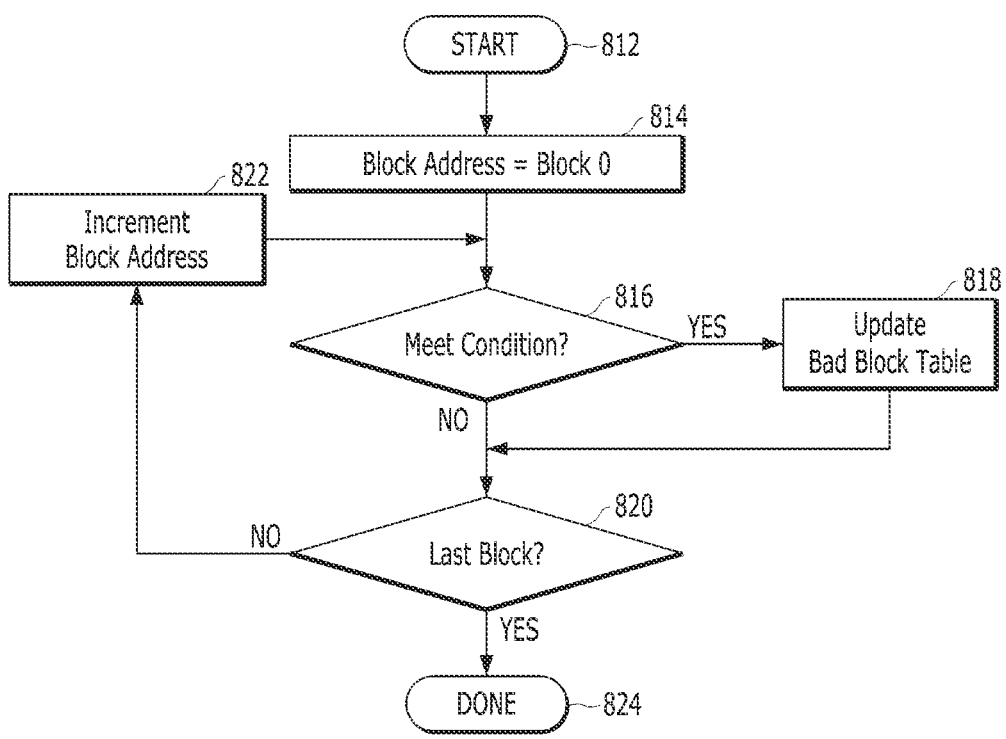
FIG. 4 is a flow chart illustrating a bad block management process according to another embodiment of the disclosure.

FIG. 4 is a flow chart illustrating a bad block management process according to another embodiment of the disclosure. An example of the bad block management described in FIG. 4 may be performed when the memory system 110 (shown in FIGS. 2 to 3) operates initially, or may be performed when the memory system 110 is in an idle state or rebooted.

Referring to FIG. 4, bad block management may be performed within a limit (e.g., operation margin) such that performance of a data input/output operation performed in the memory system 110 is not degraded (812). The memory system 110 may sequentially check whether all memory blocks in the memory device 150 (see FIGS. 2 to 3) are bad blocks. The memory system 110 may start the bad block management on a first memory block Block0 (e.g., a memory block subject to bad block management) among the plurality of memory blocks (814).

The memory system 110 may check whether the first memory block Block0 satisfies a bad block condition, which may be a preset condition (816). Here, the bad block criterion may be set in various ways according to embodiments. For example, if a defect is found in a test process after the memory device 150 is manufactured, it may be indicated that a specific memory block (the defective memory block) has a defect. The controller 130 (refer to FIGS. 2 to 3) may determine the first memory block Block0 as the bad block by checking bad block information indicating whether or not there is a defect at a specific location of the first memory block Block0. Further, according to an embodiment, after the controller 130 performs a write/program operation on the first memory block Block0, the time it takes to perform a write/program operation may be checked. When the write/program operation takes longer than a first criterion, i.e., time, or the write/program operation fails in the first memory block Block0 and is then performed on another memory block, the memory system 110 can determine the first memory block Block0 as a bad block. In another embodiment, the controller 130 may check a program/erase cycle associated with the first memory block Block0. When the program/erase cycle of the first memory block Block0 is greater than a second criterion, the controller 130 may determine the first memory block Block0 as a bad block.

When it is determined that the first memory block Block0 satisfies the bad block condition ('YES' in operation 816), the memory system 110 may perform an update by adding the first memory block Block0 to the bad block table (818).

On the other hand, if it is determined that the first memory block Block0 does not satisfy the bad block condition ('NO' in step 816), it may be determined whether the first memory block Block0 is the last memory block in the memory device 150 (820). Because the first memory block Block0 is not the last memory block in the memory device 150 ('NO' in operation 820), the memory system 110 may increment a block address (822). The memory system 110 may check whether another memory block corresponding to the incremented block address satisfies the bad block criterion (816).

In the above-described method, the memory system 110 checks all memory blocks in the memory device 150 to determine whether each meet the bad block criterion. When the bad block criterion is satisfied on a specific memory block, the memory system 110 adds the corresponding memory block to the bad block table (818). After determining whether all memory blocks in the memory device 150 satisfy the bad block criterion, the bad block management may be terminated (824). The bad block management process shown in FIG. 4 may be halted by an interrupt. When the bad block management is not complete from the first memory block to the last memory block in the memory device 150, the memory system 110 can store which memory block is subjected to the next bad block management performed later.

Figure 5:
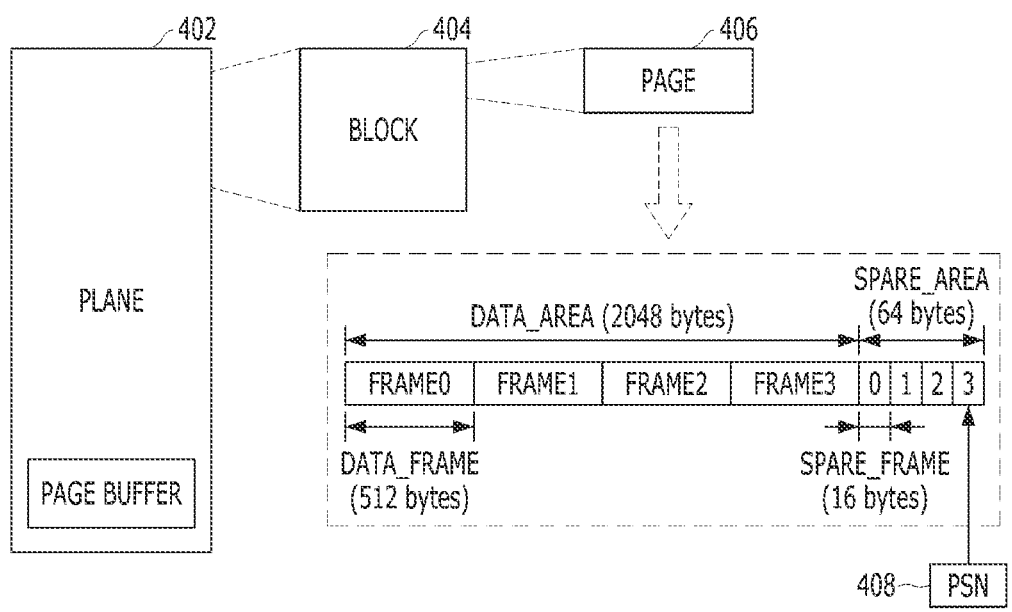
FIG. 5 illustrates a non-volatile memory device according to another embodiment of the disclosure.

FIG. 5 illustrates a non-volatile memory device according to another embodiment of the disclosure.

Referring to FIG. 5, the memory device 150 (shown in FIGS. 2 to 3) may include at least one plane 402. The plane 402 may include plural memory blocks 404 and a page buffer. Each of the plural memory blocks 404 may include plural pages 406. Here, each of the plural pages 406 may be understood as a group of non-volatile memory cells in which a read/write operation is simultaneously performed by the memory system 110 (see FIGS. 2 to 3). Each of the plural memory blocks 404 is a group of non-volatile memory cells in which an erase operation is simultaneously performed by the memory system 110. In addition, the plane 402 includes a page buffer capable of temporarily storing data related to read/write operations. Thus, the plane 402 can be understood as a structure used to support interleaving operations or parallel processing of plural data input/output operations performed in the memory system 110.

Each of the plural pages 406 may include a data area DATA_AREA for storing user data and a spare area SPARE_AREA for storing additional information or system information to support data input/output operations. FIG. 5 illustrates that the data area has a size of 2048 bytes and the spare area had a size of 64 bytes, but each of these sizes may be different depending on the manufacturing method, device design, I/O performance, and the like of the memory device 150. The spare area may be also referred to as an out-of-block (OOB) area.

Data to be stored by a user can be programmed in the data area DATA_AREA. The data area DATA_AREA illustrated in FIG. 5 may be (divided into plural data frames DATA_FRAME, each having a size of 512 bytes. The data area DATA_AREA in a single page may be divided into first to fourth data frames FRAME0 to FRAME3. According to an embodiment, the number of data frames that divide the data area DATA_AREA may vary according to an operation performed in the memory system 110. For example, the number of data frames may be different according to an error checking & correction (ECC) technique employed by the memory system 110.

Similar to the data area DATA_AREA, the spare area SPARE_AREA may be divided into a plurality of spare frames SPARE_FRAME. In FIG. 5, a spare area having a size of 64 bytes is divided into four spare frames, each having a size of 16 bytes, but the present invention is not limited thereto. In the spare area SPARE_AREA, information for the error checking & correction (ECC) technique and metadata for controlling data input/output may be stored. For example, as information regarding the checking & correction (ECC) technique, bytes of information may be stored in the spare area (SPARE_AREA) in a case of 1-bit Hamming code. According to an embodiment, in a case of BCH-4 code, 7 bytes of information may be stored in the spare area (SPARE_AREA). Further, a location for storing information regarding the error checking & correction (ECC) technique in the spare area SPARE_AREA may vary according to design and configuration of the memory device 150.

An example of meta data stored in the spare area (SPARE_AREA) is a bad block identifier such as Bad block Info (BI) or Bad Block Marker (BBM). When it is determined that data input/output cannot be completely performed on a specific memory block because a memory block contains any defect or issue, an operation state of the corresponding memory block may be represented by the bad block identifier. For example, the bad block identifier may have a size of 1 byte. When a size of a memory block or a page is sufficient, plural bad block identifiers corresponding to plural regions in the memory block or the page may be included in the spare area SPARE_AREA. According to an embodiment, the bad block identifier may be written in a spare area (SPARE_AREA) included in the first page or the last page of the memory block (or another set location of the memory block). Referring to FIG. 4, the memory system 110 may check bad block information regarding all memory blocks included in the memory device 150. The bad block identifiers (BI or BBM) stored in the spare area (SPARE_AREA) may be understood as bad block information.

According to an embodiment, a program sequence number (PSN) may be stored in the spare area SPARE_AREA. After programming user data in the data area of the page, the memory system 110 may store a program sequence number (PSN), which is a serial number corresponding to the program operation performed within the memory block, in the spare area. For example, when a 100th program operation is performed to program data on a data area of a specific page, the number '100' may be stored as a program sequence number (PSN) in a spare area of the corresponding page within a memory block. Thereafter, when another data is programmed on the next page within the memory block, the corresponding program operation is a 101st program operation, so that the number '101' may be stored as another program sequence number (PSN) corresponding to the corresponding program operation performed in the next page. For example, the program sequence number (PSN) might be recorded every storage unit which is programmed by a single program operation. When a program operation is performed on a block-by-block basis, a program sequence number (PSN) can be recorded once in the memory block. When a program operation is performed on a page-by-page basis, a program sequence number (PSN) can be recorded in every page. According to an embodiment, an actual time when the program operation is completed may be recorded instead of the program sequence number (PSN).

According to an embodiment, the program sequence number (PSN) may be used to estimate an operation state of a specific memory block or a specific page in the memory device 150. Through the program sequence number (PSN), the memory system 110 may recognize a page on which data was programmed the longest time ago, a page on which data was programmed most recently, or the like. In addition, when program sequence numbers (PSNs) corresponding to two different pages or two different blocks are similar (e.g., close to each other), this may indicate that data are distributed and stored in the two different pages or two different blocks of the memory device 150 at similar times. Also, according to an embodiment, a retention time of data programmed in a page may be estimated through a program sequence number (PSN).

FIG. 6 illustrates block parameters according to another embodiment of the disclosure.

Referring to FIG. 6, the parameters regarding each memory block may include information indicating an operation state of the corresponding memory block. For example, the parameters for memory blocks can include a Page Program Time, a Block Erase Time, Program/Erase (P/E) Cycles, and/or Data Retention. The parameters for a given memory block can be stored in a spare area of the memory block. According to an embodiment, the parameters for memory blocks may be collected for block allocation, wear leveling, garbage collection and the like.

The Page Program Time may refer to the time taken to program data in a page of the corresponding memory block. For example, the time spent for a program operation may be recorded in microseconds (μs). The memory system 110 (shown in FIGS. 2 to 3) may determine that an operation state of the corresponding memory block is not good (i.e., the corresponding memory block is not healthy) when the time it takes to perform a program operation (the Page Program Time) does not fall within a set range nor a set criterion (e.g., an operation time margin). There may be various reasons why the time it takes to perform the program operation on a specific memory block does not fall within a set range, i.e., does not satisfy a set criterion. In order to determine whether an error or a failure on the corresponding memory block is the result of a permanent or temporary cause, the memory system 110 may perform a test operation of programming data on the corresponding memory block multiple times at different times.

The Block Erase Time may refer to the time taken to erase data stored in a memory block. For example, the time spent to perform an erase operation may be recorded in milliseconds (ms). The memory system 110 (shown in FIGS. 2 to 3) may determine that an operation state of the corresponding memory block is not good when the time it takes to perform the erase operation does (the Block Erase Time) is greater than a set reference time or does not fall within a set range. There may be various reasons why the time it takes to perform the deletion operation does not fall within a set range. In order to determine whether an error or a failure on the corresponding memory block is the result of a permanent or temporary cause, the memory system 110 may perform a test operation of erasing data in the corresponding memory block multiple times at different times.

The Program/Erase (P/E) Cycles may indicate how many times an operation of programming and then erasing data in a memory block has been performed. The P/E Cycles may be used as a criterion for determining wear of the corresponding memory block. When data stored in the memory block is no longer valid after data has been programmed from the first page to the last page of the memory block, the memory system 110 may perform an erase operation on the corresponding memory block to secure storage space. Each cycle may start when any data is programmed in a memory block and ends when all data is erased in the corresponding memory block. The memory system 110 can estimate a degree of wear regarding each memory block based on P/E cycles associated with the memory block. Higher P/E cycles may indicate a higher degree of wear. According to an embodiment, the memory system 110 may use an erase count instead of the P/E Cycles.

The data retention (or data retention time) may refer to a point in time (e.g., year, month or day) at which data is programmed in a memory block. In theory, data stored in a non-volatile memory cell in a memory block would not disappear even when power is not supplied. However, as a practical matter, when data is stored for a long time, i.e., beyond a set period of time, it may be difficult to ensure that the data is reliable. The memory system 110 may check data retention of a memory block. If such check reveals that the data has been stored in that memory block for too long, the memory system 110 could copy or move valid data stored in the corresponding memory block to another memory block before the reliability of the data is in question or threatened, so that the memory system 110 can improve reliability of data stored therein.

Figure 7:
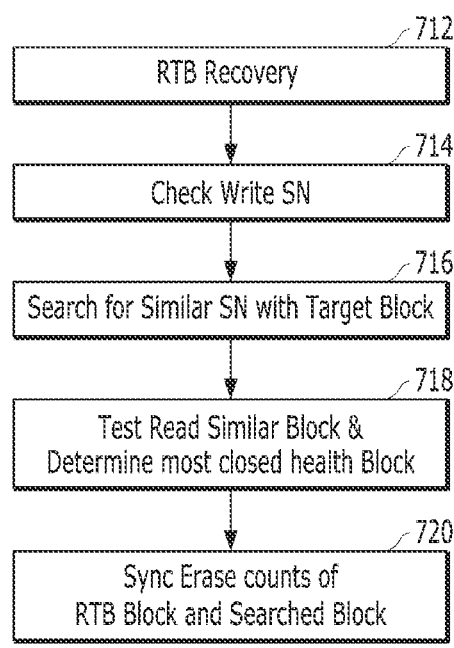
FIG. 7 illustrates a method for reusing a memory block according to an embodiment of the disclosure.

FIG. 7 illustrates a method for reusing a memory block according to an embodiment of the disclosure.

Referring to FIG. 7, the method for reusing a memory block can increase resource efficiency, or improve durability, of the memory device 150 (refer to FIGS. 2 to 3) by reusing a memory block when the memory block is determined to be a bad block so classified as a result of a temporary cause. Referring to FIG. 1, the runtime bad block management operation performed in the memory system 110 (refer to FIGS. 2 to 3) includes checking whether a runtime bad block is re-usable (918). In the operation 918, the memory system 110 may perform a test operation for determining whether the runtime bad block can operate normally. For example, a test read, program or erase operation may be performed on a specific memory block. The memory system 110 may determine whether the test operation satisfies a set criterion or condition such as an operation time margin. When determining that the runtime bad block is re-usable, an operation of restoring the runtime bad block may start (712).

The memory system 110 may check a program sequence number (PSN or Write SN) in the runtime bad block determined to be re-usable (714). When a specific memory block is determined as a runtime bad block, the memory system 110 may copy all valid data stored in the corresponding memory block to another memory block and update map information for the copied data. Through this procedure, valid data may no longer remain in the runtime bad block. Because a runtime bad block may be no longer used generally, there is no need to erase any data in the runtime bad block. Further, meta data associated with the data (such as a program sequence number (PSN or Write SN) remained in the runtime bad block might have been not erased. That is, because meta data need not be erased, the meta data may remain in the runtime bad block. When the memory system 110 determines that the runtime bad block is re-usable, a time point at which the program operation is performed in the re-usable bad block may be estimated through a first program sequence number (PSN or Write SN) in the corresponding memory block.

The memory system 110 may search for another program sequence number (Similar SN) similar, close or adjacent to, i.e., within a certain range of, the first program sequence number (Write SN or PSN) in another memory block of the memory device 150 (716). According to an embodiment, the program sequence number stored in the memory device 150 may be a unique number sequentially recorded and incremented if sequential program operations are completely performed on pages within a memory block of the memory device 150. When program sequence numbers stored in different memory blocks in the memory device 150 are similar to each other, this may indicate that program operations performed in the corresponding memory blocks are performed at similar times. For example, if a program sequence number stored in a re-usable memory block is 100 and a program sequence number stored in another memory block is 102, it can be recognized that timings of programming data in both the re-usable memory block and the another memory block are close to each other.

Although not shown, data may be sequentially programmed but erased in the memory device 150 at discrete times in response to a user's request or an internal operation. A process for finding a similar program sequence number may be performed in stages. For example, if a program sequence number stored in the reusable memory block is '100,' the memory system 110 may first search for a program sequence number of '95' to '105'. When no program sequence number between '95' and '105' is found in the memory device 150, the memory system 110 may expand the search range to find a program sequence number between '90' and '110.' According to an embodiment, a program sequence number stored in the memory device 150 may be information represented by a set number of bits. For example, when the program sequence number is 16-bit data, the memory system 110 may first search for a program sequence number having the same 13 bits starting from the most significant bit among the 16 bits, that is, disregarding the 3 least significant bits. When no such program sequence number is found, the memory system 110 can refine the search criterion to a program sequence number having the same 11 most significant bits among the 16 bits. According to an embodiment, the memory system 110 may adjust or determine the search range regarding the program sequence number.

After finding for another memory block having a program sequence number within the range searched, the memory system 110 may perform a test read operation on the re-usable memory block and the memory blocks found in the search (718). For example, when plural memory blocks including program sequence numbers in the search range are found, the memory system 110 may select, from the candidate memory blocks, a memory block having an operation state that is most similar to the re-usable memory block through a test read operation (718). Similarity of operation states can be determined based on read times of the individual memory blocks. The read time of the memory block closest to that of the re-usable memory block may be considered to have an operation state most similar to the re-usable memory block.

When a memory block (target block) having an operation state most similar to that of the re-usable memory block (RTB block) is determined (718), the memory system 110 may synchronize operation information of those two memory blocks, i.e., copy operation information of the target memory block into the re-usable memory block (720). For example, if the eleventh memory block in the memory device 150 has an operation state most similar to that of the reusable memory block, information on the eleventh memory block may be copied to the re-usable memory block. The copied information may be integrated with other information on the re-usable memory block. Here, the information on the memory block to be copied may include Program/Erase (P/E) Cycles or Erase Count. Referring to FIG. 6, there are various types of information (i.e., parameters) for each memory block. Because an erase operation should be performed on the reusable memory block to store new data, the memory system 110 might not copy other information, i.e., information on characteristics other than the Program/Erase Cycles.

Even if wear and health information regarding a specific memory block is erased when the corresponding memory block is determined as a runtime bad block, wear and health information regarding a re-usable memory block between runtime bad blocks identified by the bad block table may be estimated and recovered by the above-described processes. Through this procedure, the memory system 110 can efficiently improve management and control of the re-usable memory block.

Figure 8:
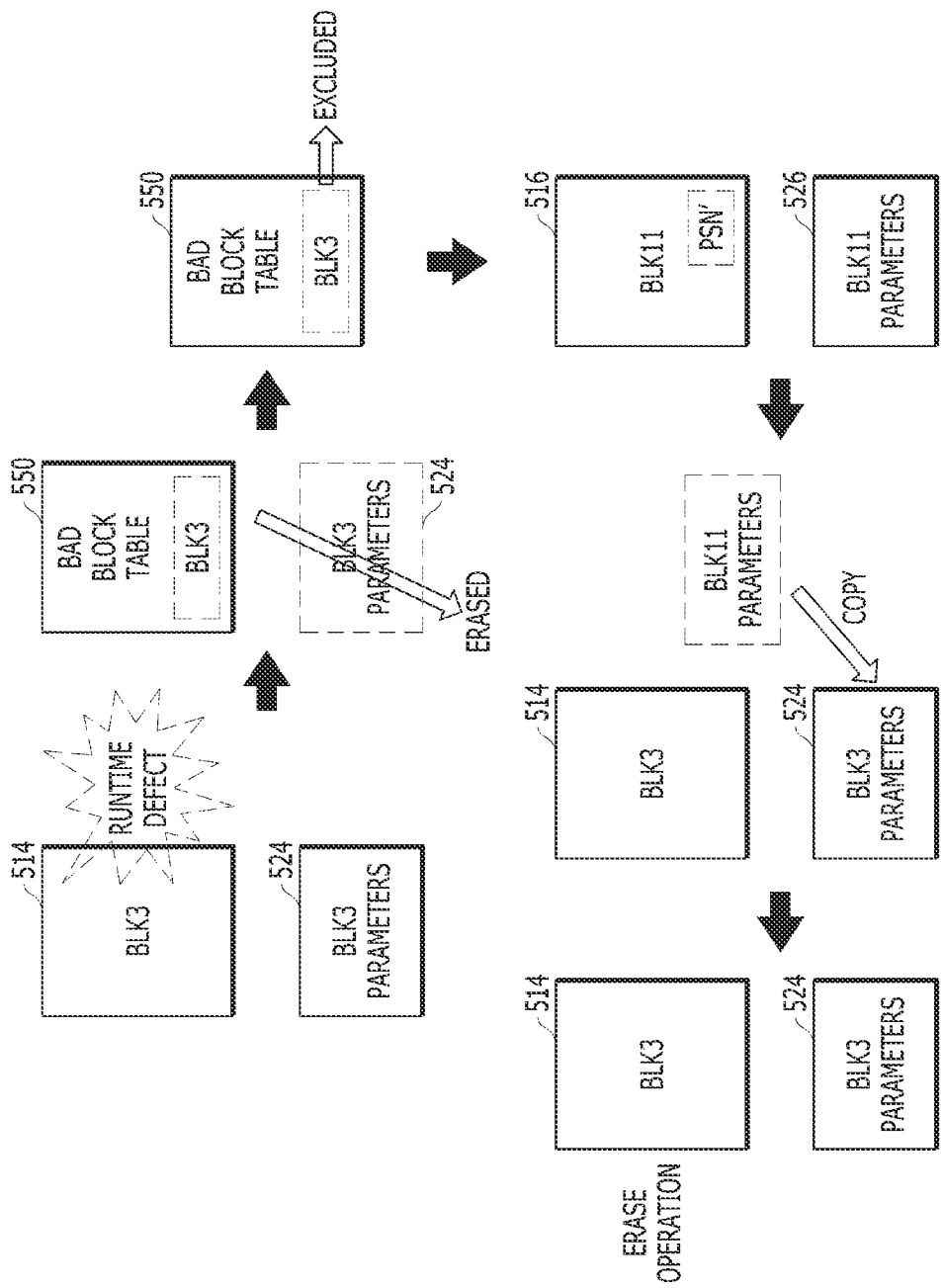
FIG. 8 illustrates a runtime bad block management operation performed in a memory system according to another embodiment of the disclosure.

FIG. 8 illustrates a runtime bad block management operation performed in a memory system according to another embodiment of the disclosure. Specifically, FIG. 8 describes a procedure in which a third memory block 514 included in the memory device 150 (see FIGS. 2 to 3) is determined as a runtime bad block and then reused later.

Referring to FIG. 8, the memory system 110 (refer to FIGS. 2 to 3) may include a third memory block 514 and operation information 524 associated with the third memory block 514. It is assumed that a runtime defect (RUNTIME DEFECT) occurs in the third memory block 514. The operation information 524 may include plural parameters shown in FIG. 6. According to an embodiment, the controller 130 can collect operation information from each memory block included in the memory device 150, and utilize the collected operation information for block allocation, wear leveling, garbage collection and the like.

The memory system 110 may determine the third memory block 514 is a runtime bad block and add information on the third memory block BLK3 to a bad block table 550. Since information on the third memory block BLK3 is added to the bad block table 550, the memory system 110 may erase the operation information 524 associated with the third memory block 514 to reduce an operational burden for control/management.

The memory system 110 may perform a test operation on the third memory block 514 later and determine whether the third memory block 514 is re-usable. When the memory system 110 determines that the third memory block 514 is re-usable, the positional information regarding the third memory block 514 may be removed from the bad block table 550.

The memory system 110 may search for a program sequence number, which is similar to, i.e., within a set numerical range of, a first program sequence number PSN remaining in the third memory block 514, in another memory block of the memory device 150. As a result, the memory system 110 may determine that a second program sequence number PSN' recorded in an eleventh memory block 516 of the memory device 150 is within the set range of the first program sequence number PSN. After performing a test read operation on the third memory block 514 and the eleventh memory block 516, the memory system 110 can determine that the third memory block 514 and the eleventh memory block 516 have similar operation states, based on a test result (e.g., a difference between read times tRDs is less than a threshold).

When the memory system 110 determines that the operation states of the third memory block 514 and the eleventh memory block 516 are similar, operation information 526 of the eleventh memory block 516 is copied to the operation information 524 associated with the third memory block 514, which had been erased when the third memory block 514 is added to the bad block table 550. Copied information may be considered the operation information 524 associated with the third memory block 514. Accordingly, the operation information 524 previously erased may be restored.

Thereafter, the memory system 110 may perform an erase operation on the third memory block 514. Through this procedure, the third memory block 514 in the memory device 150 may be changed to a state in which new data can be programmed.

As described above, the memory system 110 can determine a specific memory block in the memory device 150 as a runtime bad block, determine whether the runtime bad block is re-usable later, and then determine information regarding re-usable memory block based on information of another memory block found in a search based on the program sequence number. Through this procedure, an operation state of the memory block to be re-used is estimated, and a problem or an issue that may occur when the re-used memory block is indicated as having an initialized or inappropriate operation state which is different from the actual state of the re-used memory block can be reduced or avoided.

In an embodiment, the memory system according to an embodiment of the disclosure may re-use a memory block, which has been determined as a bad block, based on an estimated state to increase a lifespan of a non-volatile memory device and avoid a reduction of available storage capacity in the non-volatile memory device.

In addition, the memory system according to another embodiment of the disclosure can estimate a state of a re-usable memory block among bad blocks, thereby improving safety and reliability of data input/output operations performed on the re-usable memory block.

While the present teachings have been illustrated and described with respect to specific embodiments, it will be apparent to those skilled in the art in light of the present disclosure that various changes and modifications may be made without departing from the spirit and scope of the invention as defined in the following claims.

What is claimed is:

1. A memory system, comprising:
   a memory device including plural non-volatile memory blocks; and
   a controller configured to:
      determine whether a first memory block, among the plural non-volatile memory blocks, is re-usable after the first memory block is determined to be a bad block, and
      copy second block information associated with a second memory block including a second program sequence number within a set range of a first program sequence number in the first memory block to first block information of the first memory block.

2. The memory system according to claim 1, wherein the controller is further configured to:
   perform a data input/output operation on at least one memory block among the plural non-volatile memory blocks, and
   determine that the at least one memory block is the bad block when the at least one memory block satisfies a set condition during the data input/output operation.

3. The memory system according to claim 1, wherein the data input/output operation includes at least one of a read, a write or an erase operation.

4. The memory system according to claim 1, wherein each of the first block information and the second block information include a program/erase (P/E) cycle of the corresponding memory block.

5. The memory system according to claim 1, wherein the controller is further configured to find the second memory block in a search of memory blocks by comparing a set number of most significant bits of the first program sequence number with those of a program sequence number of each of the memory blocks.

6. The memory system according to claim 5, wherein, when multiple memory block candidates have the set number of most significant bits, the controller finds the second memory block by:
   performing a test read operation on each of the first memory block and the candidates, and
   determining a single memory block among the candidates as the second memory block, the single memory block having an operating state which is the most similar to that of the first memory block.

7. The memory system according to claim 1, wherein the controller is further configured to erase the first block information of the first memory block when the first memory block is determined to be the bad block.

8. The memory system according to claim 1, wherein the controller is further configured to determine the first memory block to be a bad block through an operation for wear levelling or bad block management which is performed in the memory system without a request from an external device.

9. A method for operating a memory system, comprising:
   determining whether a first memory block, among plural non-volatile memory blocks in a memory device, is re-usable after the first memory block is determined to be a bad block;
   searching for a second memory block including a second program sequence number within a set range of a first program sequence number in the first memory block; and
   copying second block information associated with the second memory block into first block information of the first memory block.

10. The method according to claim 9, further comprising:
    performing a data input/output operation on at least one memory block among the plural non-volatile memory blocks; and
    determining that the at least one memory block is the bad block when the at least one memory block satisfies a set condition during the data input/output operation.

11. The method according to claim 10, wherein the data input/output operation includes at least one of a read, a write or an erase operation.

12. The method according to claim 9, wherein each of the first block information and the second block information includes a program/erase (P/E) cycle of the corresponding memory block.

13. The method according to claim 9, wherein the second memory block is found in a search by comparing a set number of most significant bits of the first program sequence number with those of a program sequence number of each of the memory blocks.

14. The method according to claim 13, wherein, when multiple memory block candidates have the same number of most significant bits, the searching for the second memory block includes:
  performing a test read operation on each of the first memory block and the candidates, and
  determining a single memory block among the candidates as the second memory block, the single memory block having an operating state which is the most similar to that of the first memory block.

15. The method according to claim 9, further comprising:
  erasing the first block information of the first memory block when the first memory block is determined to be the bad block.

16. The method according to claim 9, further comprising determining the first memory block to be the bad block through an operation for wear levelling or bad block management which is performed in the memory system without a request from an external device.

17. A controller which monitors operation states of plural memory blocks and determines a first memory block among the plural memory blocks to be a bad block when an operation state of the first memory block meets a set condition, wherein the controller is configured to:
  determine whether the first memory block is re-usable after the first memory block is determined to be a bad block; and
  copy second block information associated with a second memory block including a second program sequence number within a set range of a first program sequence number in the first memory block into first block information of the first memory block.

18. The controller according to claim 17, wherein the controller is further configured to:
  perform a data input/output operation on at least one memory block among the plural non-volatile memory blocks, and
  determine that the at least one memory block is the bad block when the at least one memory block satisfies a set condition during the data input/output operation.

19. The controller according to claim 17, wherein the controller is further configured to find the second memory block in a search of memory blocks by comparing a set number of most significant bits of the first program sequence number with those of a program sequence number of each of the memory blocks.

20. The controller according to claim 19, wherein, when multiple memory block candidates have the same set number of most significant bits, the controller finds the second memory block by:
  performing a test read operation on each of the first memory block and the candidates, and
  determining a single memory block among the candidates as the second memory block, the single memory block having an operating state which is the most similar to that that of the first memory block.

* * * * *